United States Patent
Song et al.

(10) Patent No.: US 12,046,464 B2
(45) Date of Patent: Jul. 23, 2024

(54) SUBSTRATE CLEANING COMPOSITION, METHOD FOR CLEANING SUBSTRATE USING THE SAME, AND METHOD FOR FABRICATING SEMICONDUCTOR DEVICE USING THE SAME

(71) Applicant: SAMSUNG ELECTRONICS CO., LTD., Suwon-si (KR)

(72) Inventors: Ga Young Song, Busan (KR); Mi Hyun Park, Seongnam-si (KR); Jong Kyoung Park, Suwon-si (KR); Jung Youl Lee, Anyang-si (KR); Hyun Jin Kim, Anyang-si (KR); Hyo San Lee, Hwaseong-si (KR); Han Sol Lim, Incheon (KR); Hoon Han, Anyang-si (KR)

(73) Assignees: SAMSUNG ELECTRONICS CO., LTD., Suwon-si (KR); DONGJIN SEMICHEM CO., LTD., Incheon (KR)

( * ) Notice: Subject to any disclaimer, the term of this patent is extended or adjusted under 35 U.S.C. 154(b) by 44 days.

(21) Appl. No.: 17/719,561

(22) Filed: Apr. 13, 2022

(65) Prior Publication Data

US 2022/0336206 A1 Oct. 20, 2022

(30) Foreign Application Priority Data

Apr. 15, 2021 (KR) .................. 10-2021-0049281
Apr. 13, 2022 (KR) .................. 10-2022-0045802

(51) Int. Cl.
*C11D 1/00* (2006.01)
*C11D 3/20* (2006.01)
(Continued)

(52) U.S. Cl.
CPC ...... *H01L 21/02041* (2013.01); *C11D 3/2003* (2013.01); *C11D 3/2079* (2013.01); *C11D 3/3749* (2013.01)

(58) Field of Classification Search
CPC ....... C11D 1/00; C11D 3/2003; C11D 3/2006; C11D 3/201; C11D 3/2017; C11D 3/2075; C11D 3/37
See application file for complete search history.

(56) References Cited

U.S. PATENT DOCUMENTS 5,300,628 A   4/1994 Honda
7,851,426 B2  12/2010 Nishiwaki
(Continued)

FOREIGN PATENT DOCUMENTS

JP   2017-112200 A   6/2017
KR   10-1932160 B1   12/2018
WO   WO 2020/0120534 A1   6/2020

*Primary Examiner* — Brian P Mruk
(74) *Attorney, Agent, or Firm* — Muir Patent Law, PLLC

(57) ABSTRACT

A substrate cleaning composition, a method of cleaning a substrate using the same, and a method of fabricating a semiconductor device using the same, the substrate cleaning composition including a styrene copolymer including a first repeating unit represented by Formula 1-1a and a second repeating unit represented by Formula 1-1b; an additive represented by Formula 2-1; and an alcoholic solvent having a solubility of 500 g/L or less in deionized water,

[Formula 1-1a]

(Continued)

-continued

[Formula 1-1b]

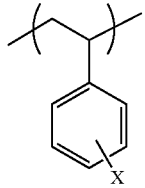

[Formula 2-1]

$R^2Y_p$.

20 Claims, 7 Drawing Sheets

(51) Int. Cl.
*C11D 3/37* (2006.01)
*H01L 21/02* (2006.01)

(56) References Cited

U.S. PATENT DOCUMENTS

| | | |
|---|---|---|
| 9,213,242 B2 | 12/2015 | Uozumi et al. |
| 2009/0114246 A1* | 5/2009 | Sinha ................. B08B 7/02 |
| | | 134/26 |
| 2016/0163534 A1 | 6/2016 | Kaneko et al. |
| 2018/0086943 A1 | 3/2018 | Hayama et al. |

* cited by examiner

SUBSTRATE CLEANING COMPOSITION, METHOD FOR CLEANING SUBSTRATE USING THE SAME, AND METHOD FOR FABRICATING SEMICONDUCTOR DEVICE USING THE SAME

CROSS-REFERENCE TO RELATED APPLICATION

This application claims priority from Korean Patent Application No. 10-2021-0049281 filed on Apr. 15, 2021, and Korean Patent Application No. 10-2022-0045802 filed on Apr. 13, 2022, in the Korean Intellectual Property Office, the disclosure of which is incorporated herein by reference in its entirety.

BACKGROUND

1. Field

Embodiments relate to a substrate cleaning composition, a method of cleaning a substrate using the same and a method of fabricating a semiconductor device using the same.

2. Description of the Related Art

As semiconductor devices are more and more highly integrated, finer patterns may be formed, and for this, in each process of a semiconductor device, many residues or contaminants (e.g., particles) may be generated. Such particles may distort the structural shape of micro-patterns and lower electrical properties, resulting in decreases in performance, reliability, and yield of a semiconductor device. Accordingly, a cleaning process for removing particles has been considered.

SUMMARY

The embodiments may be realized by providing a substrate cleaning composition including a styrene copolymer including a first repeating unit represented by Formula 1-1a and a second repeating unit represented by Formula 1-1b, an additive represented by Formula 2-1, and an alcoholic solvent having a solubility of 500 g/L or less in deionized water,

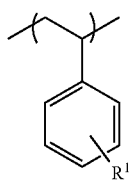

[Formula 1-1a]

wherein, in Formula 1-1a, $R^1$ is a hydrogen atom, or a substituted or unsubstituted C1 to C20 hydrocarbon group,

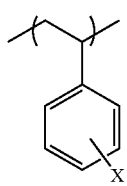

[Formula 1-1b]

wherein, in Formula 1-1b, X is a hydrophilic functional group, $$R^2Y_p$$ [Formula 2-1]

wherein, in Formula 2-1, $R^2$ is a substituted or unsubstituted C3 to C25 hydrocarbon group, Y is a hydrophilic functional group, and p is a natural number.

The embodiments may be realized by providing a substrate cleaning composition including a styrene copolymer including a first repeating unit represented by Formula 1-2a and a second repeating unit represented by Formula 1-2b, an additive represented by Formula 2-2, and an alcoholic solvent having a solubility of 500 g/L or less in deionized water,

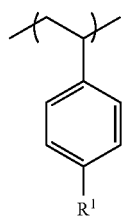

[Formula 1-2a]

wherein, in Formula 1-2a, $R^1$ is a hydrogen atom, or substituted or unsubstituted C1 to C20 hydrocarbon group,

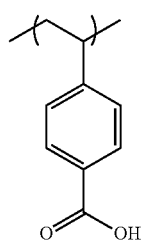

[Formula 1-2b]

[Formula 2-2]

wherein, in Formula 2-2, $R^2$ is a substituted or unsubstituted C3 to C25 hydrocarbon group, and q is a natural number of 2 or more.

The embodiments may be realized by providing a method of cleaning a substrate, the method including providing a substrate, providing a substrate cleaning composition on the substrate to form a coating film, and rinsing the substrate to remove the coating film, wherein the substrate cleaning composition includes a styrene copolymer including a first repeating unit represented by Formula 1-1a and a second repeating unit represented by Formula 1-1b, an additive represented by Formula 2-1, and an alcoholic solvent having a solubility of 500 g/L or less in deionized water,

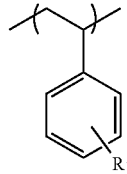

[Formula 1-1a]

in Formula 1-1a, $R^1$ is a hydrogen atom, or a substituted or unsubstituted C1 to C20 hydrocarbon group,

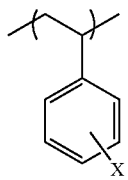

[Formula 1-1b]

wherein, in Formula 1-1b, X is a hydrophilic functional group, $$R^2Y_p \quad \text{[Formula 2-1]}$$

wherein, in Formula 2-1, $R^2$ is a substituted or unsubstituted C3 to C25 hydrocarbon group, Y is a hydrophilic functional group, and p is a natural number.

The embodiments may be realized by providing a method of fabricating a semiconductor device, the method including forming a material film on a semiconductor substrate; patterning the material film; and cleaning the semiconductor substrate using a substrate cleaning composition; wherein the substrate cleaning composition includes a styrene copolymer including a first repeating unit represented by Formula 1-1a and a second repeating unit represented by Formula 1-1b, an additive represented by Formula 2-1, and an alcoholic solvent having a solubility of 500 g/L or less in deionized water,

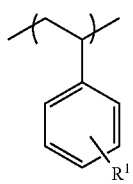

[Formula 1-1a]

in Formula 1-1a, $R^1$ is a hydrogen atom, or a substituted or unsubstituted C1 to C20 hydrocarbon group,

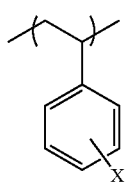

[Formula 1-1b]

wherein, in Formula 1-1b, X is a hydrophilic functional group, $$R^2Y_p \quad \text{[Formula 2-1]}$$

wherein, in Formula 2-1, $R^2$ is a substituted or unsubstituted C3 to C25 hydrocarbon group, Y is a hydrophilic functional group, and p is a natural number.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
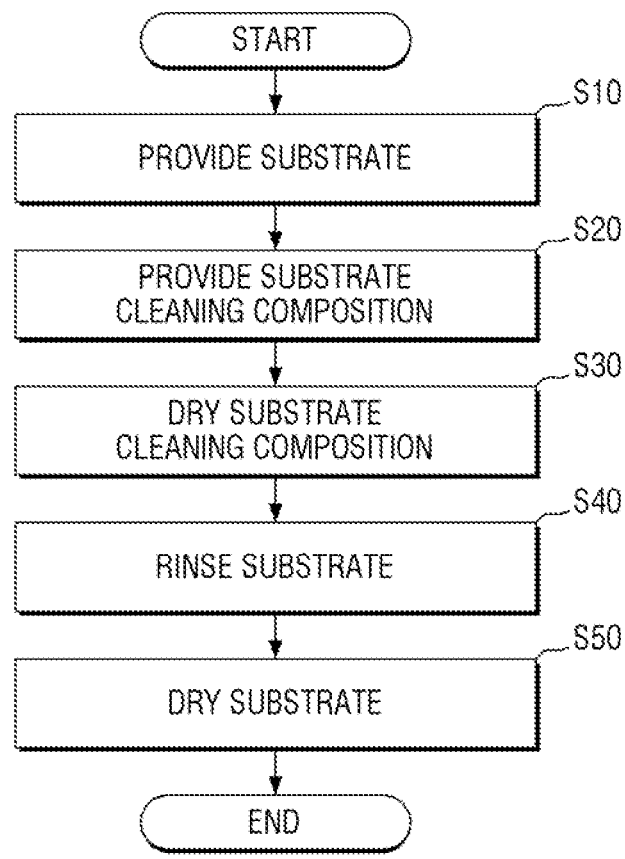
FIG. 1 is a flowchart of a method of cleaning a substrate according to some embodiments.

A substrate cleaning composition according to some embodiments may include, e.g., a styrene copolymer, an additive, and an alcoholic solvent. A solid coating film may be formed on a substrate using the substrate cleaning composition, and then removed, thereby removing microparticles (e.g., contaminants) from the substrate.

The styrene copolymer may serve to detach microparticles from the substrate. In an implementation, the styrene copolymer may be, e.g., a chain copolymer including a first repeating unit represented by Formula 1-1a below and a second repeating unit represented by Formula 1-1b below. The styrene copolymer may be a random copolymer or a block copolymer.

[Formula 1-1a]

[Formula 1-1b]

In Formula 1-1a, $R^1$ may be or may include, e.g., a hydrogen atom, or a substituted or unsubstituted C1 to C20 hydrocarbon group. In an implementation, $R^1$ may be, e.g., a C1 to C20 hydrocarbon group (α), a group having a divalent heteroatom-containing group between C—C of the hydrocarbon group (α), or a group in which a part of all of hydrogen atoms of the hydrocarbon group (α) or the group having a divalent heteroatom-containing group are substituted with a monovalent heteroatom-containing group. As used herein, the term "or" is not an exclusive term, e.g., "A or B" would include A, B, or A and B.

In an implementation, the C1 to C20 hydrocarbon group may be, e.g., a C1 to C20 chain hydrocarbon group, a C3 to C20 alicyclic hydrocarbon group, or a C6 to C20 aromatic hydrocarbon group.

In an implementation, the C1 to C20 chain hydrocarbon group may be, e.g., an alkyl group such as a methyl group, an ethyl group, a propyl group, or a butyl group, an alkenyl group such as an ethenyl group, a propenyl group, or a butenyl group, or an alkynyl group such as an ethynyl group, a propynyl group, or a butynyl group.

In an implementation, the C3 to C20 alicyclic hydrocarbon group may be, e.g., a cycloalkyl group such as a cyclopentyl group or a cyclohexyl group, a bridged cyclic saturated hydrocarbon such as a norbornyl group, an adamantyl group, or a tricyclodecanyl group, a cycloalkenyl group such as a cyclopentenyl group or a cyclohexenyl group, or a bridged cyclic unsaturated hydrocarbon such as a norbornenyl group or a tricyclodecenyl group.

In an implementation, the C6 to C20 aromatic hydrocarbon group may be, e.g., an aryl group such as a phenyl group or a naphthyl group.

In an implementation, the heteroatom constituting the divalent heteroatom-containing group or the monovalent heteroatom-containing group may be, e.g., an oxygen atom, a nitrogen atom, a sulfur atom, a phosphorous atom, a silicon atom, or a halogen atom. The halogen atom may be, e.g., a fluorine atom, a chlorine atom, a bromine atom, or an iodine atom. In an implementation, the divalent heteroatom-containing group may be, e.g., —O—, —CO—, —S—, —CS—, —NR¹—, or a combination thereof. In an implementation, the monovalent heteroatom-containing group may be, e.g., a halogen atom such as a fluorine atom, a chlorine atom, a bromine atom, or an iodine atom, a hydroxy group, a carboxyl group, a cyano group, an amino group, or a sulfinyl group.

In Formula 1-1b, X may be, e.g., a hydrophilic functional group. In an implementation, X may be or may include, e.g., a hydroxy group, a carboxyl group, an amino group, or a thiol group. In an implementation, X may be, e.g., a carboxyl group.

In an implementation, the styrene copolymer may be a chain copolymer prepared by polymerizing a 4-alkyl styrene and 4-vinylbenzoic acid. In an implementation, the styrene copolymer may include a first repeating unit represented by Formula 1-2a below and a second repeating unit represented by Formula 1-2b below.

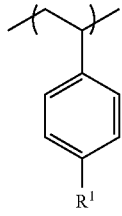

[Formula 1-2a]

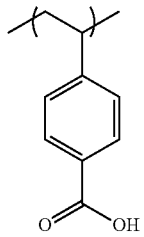

[Formula 1-2b]

In Formula 1-2a, $R^1$ may be or may include, e.g., a hydrogen atom, or a substituted or unsubstituted C1 to C20 hydrocarbon group.

In an implementation, the styrene-based copolymer may have a weight-average molecular weight (Mw) of, e.g., approximately 500 to 100,000. In an implementation, the styrene-based copolymer may have a weight-average molecular weight (Mw) of, e.g., approximately 1,000 to 50,000, or approximately 1,500 to 20,000. The weight-average molecular weight may be a value measured by gel permeation chromatography (GPC).

In an implementation, a content of the styrene copolymer may be, e.g., approximately 1 to 50 wt %, with respect to 100 wt % (e.g., based on a total weight) of the substrate cleaning composition. Maintaining the content of the styrene copolymer at about 1 wt % or greater may help ensure that microparticles are detached from a substrate. Maintaining the content of the styrene copolymer at about 50 wt % or less may help ensure that the substrate may be uniformly coated with the substrate cleaning composition. In an implementation, the content of the styrene copolymer may be approximately 5 wt % to 20 wt % with respect to 100 wt % of the substrate cleaning composition.

The additive may facilitate the removal of a solid coating film formed from the substrate cleaning composition. In an implementation, the additive may be a compound represented by, e.g., Formula 2-1, rather than a polymer.

$$R^2 Y_p \qquad \text{[Formula 2-1]}$$

In Formula 2-1, $R^2$ may be or may include, e.g., a substituted or unsubstituted C3 to C25 hydrocarbon group. In an implementation, $R^2$ may be, e.g., a C3 to C25 hydrocarbon group (β), a group having a divalent heteroatom-containing group between C—C of the hydrocarbon group (β), or a group in which a part of all of hydrogen atoms of the hydrocarbon group (β) or the group having a divalent heteroatom-containing group are substituted with a monovalent heteroatom-containing group.

In an implementation, the C3 to C25 hydrocarbon group may be, e.g., a C3 to C25 chain hydrocarbon group, a C3 to C25 alicyclic hydrocarbon group, or a C6 to C25 aromatic hydrocarbon group.

In an implementation, the C3 to C25 chain hydrocarbon group may be, e.g., an alkyl group such as a propyl group or a butyl group, an alkenyl group such as propenyl group or a butenyl group, or an alkynyl group such as a propynyl group or a butynyl group.

In an implementation, the C3 to C25 alicyclic hydrocarbon group may be, e.g., a cycloalkyl group such as a cyclopentyl group or a cyclohexyl group, a bridged cyclic saturated hydrocarbon such as a norbornyl group, an adamantyl group, or a tricyclodecanyl group, a cycloalkenyl group such as a cyclopentenyl group or a cyclohexenyl group, or a bridged cyclic unsaturated hydrocarbon such as a norbornenyl group or a tricyclodecenyl group.

In an implementation, the C6 to C25 aromatic hydrocarbon group may be, e.g., an aryl group such as a phenyl group or a naphthyl group.

In Formula 2-1, Y may be, e.g., a hydrophilic functional group, and p may be a natural number. In an implementation, Y may be, e.g., a hydroxy group, a carboxyl group, an amino group, or a thiol group. In an implementation, Y may be, e.g., a carboxyl group.

In an implementation, the additive may include, e.g., a carboxylic acid having an aliphatic hydrocarbon group, a carboxylic acid having an aromatic hydrocarbon group, a carboxylic acid having a heteroatom, or a combination thereof.

In an implementation, the carboxylic acid having an aliphatic hydrocarbon group may be, e.g., acetic acid, propionic acid, butanoic acid, pentanoic acid, hexanoic acid, cyclohexane carboxylic acid, cyclohexylacetic acid, 1-adamantanecarboxylic acid, (meth)acrylic acid, crotonic acid, cinnamic acid, or sorbic acid.

In an implementation, the carboxylic acid having an aromatic hydrocarbon group may be, e.g., benzoic acid or phenylacetic acid.

In an implementation, the carboxylic acid having a heteroatom may be, e.g., difluoroacetic acid, trifluoroacetic acid, pentafluoropropanoic acid, heptafluorobutanoic acid, fluorophenylacetic acid, difluorobenzoic acid, 10-hydroxydecanoic acid, 5-oxohexanoic acid, 3-methoxycyclohexanecarboxylic acid, camphorcarboxylic acid, dinitrobenzoic acid, nitrophenylacetic acid, lactic acid, glycolic acid, glyceric acid, salicylic acid, anisic acid, gallic acid, or furancarboxylic acid.

In an implementation, the additive may include two or more carboxyl groups per molecule. In an implementation, the additive may be represented by, e.g., Formula 2-2. In Formula 2-2, $R^2$ may be defined the same as that of Formula 2-1, and q represents a natural number of 2 or more.

$$R^2(COOH)_q \qquad \text{[Formula 2-2]}$$

In an implementation, the additive may include, e.g., a polycarboxylic acid having an aliphatic hydrocarbon group or an aromatic hydrocarbon group, a polycarboxylic acid having a heteroatom, or a combination thereof.

In an implementation, the polycarboxylic acid having an aliphatic hydrocarbon group or an aromatic hydrocarbon group may be, e.g., oxalic acid, malonic acid, succinic acid, glutaric acid, adipic acid, dodecanedicarboxylic acid, propanetricarboxylic acid, butanetetracarboxylic acid, cyclohexanehexacarboxylic acid, 1,4-naphthalenedicarboxlic acid, phthalic acid, isophthalic acid, terephthalic acid, trimellitic acid, pyromellitic acid, 1,2,3,4-cyclobutanetetracarboxylic acid, maleic acid, fumaric acid, aconitic acid, or a partial ester thereof.

In an implementation, the polycarboxylic acid having a heteroatom may be, e.g., difluoromalonic acid, tetrafluorophthalic acid, hexafluoroglutaric acid, tartaric acid, malic acid, tartronic acid, diglycolic acid, or iminodiacetic acid.

In an implementation, the additive may include, e.g., malonic acid, succinic acid, glutaric acid, adipic acid, dodecanedicarboxylic acid, propanetricarboxylic acid, butanetetracarboxylic acid, cyclohexanehexacarboxylic acid, 1,4-naphthalenedicarboxlic acid, phthalic acid, isophthalic acid, terephthalic acid, trimellitic acid, pyromellitic acid, citric acid, malic acid, aconitic acid, 1,2,3,4-cyclobutanetetracarboxylic acid, or a combination thereof.

In an implementation, a content of the additive may be, e.g., approximately 0.001 to 20 wt % with respect to 100 wt % of the substrate cleaning composition. Maintaining the content of the additive at 0.001 wt % or greater may help ensure that a solid coating film formed from the substrate cleaning composition may be easily removed. Maintaining the content of the additive at 20 wt % or less may help ensure that microparticles may be detached from the substrate. In an implementation, the content of the additive may be, e.g., approximately 0.01 to 2 wt % with respect to 100 wt % of the substrate cleaning composition.

The alcoholic solvent may have a solubility of 500 g/L or less in deionized water. When the solubility of the alcoholic solvent in deionized water exceeds 500 g/L, due to the high hydrophilicity of the substrate cleaning composition, spreadability is reduced during coating on the substrate to form a poorly coated film, or cracking is not smoothly formed in the cracking process using deionized water so that the particle removal ability may be remarkably reduced. Preferably, the solubility of the alcoholic solvent in deionized water may be 250 g/L or less. More preferably, the solubility of the alcoholic solvent in deionized water may be 190 g/L or less.

The alcohol solvent with the solubility of 500 g/L or less in deionized water may include, e.g., a linear or cyclic monohydric alcohol solvent having 4 or more carbon atoms, such as n-butanol, iso-butanol, 4-methyl-2-pentanol, n-pentanol, iso-pentanol, n-hexanol, cyclohexanol. The substrate cleaning composition may be effectively applied on a substrate (e.g., a semiconductor wafer) by including the alcoholic solvent.

In an implementation, the alcoholic solvent may include n-butanol or 4-methyl-2-pentanol. When n-butanol is included as the alcoholic solvent, the substrate cleaning composition has excellent permeability, thereby providing improved particle removal ability in the cracking process of the coating film using deionized water. When 4-methyl-2-pentanol is included as the alcoholic solvent, the substrate cleaning composition has excellent coatability, so that it is possible to provide a good quality coating film when coated on a substrate. Preferably, the alcoholic solvent may include both n-butanol and 4-methyl-2-pentanol. Through this, the substrate cleaning composition can provide improved particle removal ability and a good quality coating film at the same time.

In an implementation, the substrate cleaning composition may further include a surfactant. The surfactant may help improve the applicability of the substrate cleaning composition. In an implementation, the surfactant may include a non-ionic surfactant, a cationic surfactant, an anionic surfactant, or a combination thereof.

The non-ionic surfactant may include, e.g., an ether non-ionic surfactant such as polyoxyethylene alkyl ether; an ether ester non-ionic surfactant such as polyoxyethylene ether of glycerin ester; or an ester non-ionic surfactant such as polyethylene glycol fatty acid ester, glycerin ester, or sorbitan ester.

The cationic surfactant may include, e.g., an aliphatic amine salt or an aliphatic ammonium salt.

The anionic surfactant may include, e.g., a carboxylic acid salt such as fatty acid soap or an alkyl ether carboxylic acid salt; a sulfonic acid salt such as alkylbenzene sulfonate, alkylnaphthalene sulfonate or α-olefin sulfonate; a sulfuric acid salt such as high alcohol benzene sulfate or alkyl ether sulfate, or a phosphoric acid ester salt such as alkyl phosphoric acid ester.

In an implementation, a concentration (e.g., by weight) of the surfactant in the substrate cleaning composition may be, e.g., approximately 10 to 50,000 ppm. In an implementation, the concentration of the surfactant in the substrate cleaning composition may be, e.g., approximately 1,000 to 10,000 ppm.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation Example 1-1

Styrene 2.1 g (0.02 mol), 4-carboxystyrene 26.6 g (0.09 mol) and THF (tetrahydrofuran) 80 g were put in a nitrogen refluxed 500 mL reactor, and the reaction temperature was raised to 70° C. Then, after dissolving 5 mol % of AIBN (azobisisobutyronitrile) in THF, it was put into the reactor and polymerization was performed for 15 hours.

After the polymerization time was completed, the reactant was slowly added dropwise to an excess of heptane solution to precipitate. The obtained precipitate was filtered through a filter and dried for 1 day in a vacuum oven maintained at 40° C. Through this, as the styrene copolymer, poly(styrene-co-4-vinylbenzoic acid) having a weight average molecular weight (Mw) of about 8100 was obtained.

Preparation Examples 1-2 to 1-6

Styrene copolymers were obtained in the same manner as in Preparation Example 1-1, except that monomers were changed as shown in Table 1 below.

TABLE 1

| | styrene | 4-carboxystyrene | 4-methylstyrene | Mw | yield (%) |
|---|---|---|---|---|---|
| Preparation Example 1-1 | 1.04 | 13.32 | | 8100 | 78 |
| Preparation Example 1-2 | 3.12 | 10.36 | | 9300 | 92 |
| Preparation Example 1-3 | 10.4 | 14.8 | | 9500 | 95 |
| Preparation Example 1-4 | 7.28 | 4.44 | | 9200 | 96 |
| Preparation Example 1-5 | 1.04 | 13.32 | | 9300 | 92 |
| Preparation Example 1-6 | | 14.8 | 11.8 | 7200 | 89 |

Preparation Examples 2-1

2 g of the styrene copolymer (poly(styrene-co-4-vinylbenzoic acid)) prepared according to Preparation Example 1-1 was mixed with 4-methyl-2-pentanol and n-butanol, and then 0.4 g of adipic acid as the additive was added and completely dissolved. The obtained solution was filtered through a 0.2 μm membrane filter to prepare a substrate cleaning composition.

Preparation Examples 2-2 to 2-7 and Comparative Examples 1-1 to 1-9

Substrate cleaning compositions were prepared in the same manner as in Preparation Example 2-1, except that styrene copolymers and organic solvents were changed as shown in Table 2 below.

TABLE 2

| | styrene copolymer | additive [g] | organic solvent | | | |
|---|---|---|---|---|---|---|
| | | | 4-methyl-2-pentanol | n-butanol | PGME | PGMEA |
| Preparation Example 2-1 | 2 g of Preparation Example 1-1 | 0.4 | 20 | 8 | 0 | 0 |
| Preparation Example 2-2 | 2 g of Preparation Example 1-2 | 0.4 | 20 | 8 | 0 | 0 |
| Preparation Example 2-3 | 2 g of Preparation Example 1-3 | 0.4 | 20 | 8 | 0 | 0 |
| Preparation Example 2-4 | 2 g of Preparation Example 1-4 | 0.4 | 20 | 8 | 0 | 0 |
| Preparation Example 2-5 | 2 g of Preparation Example 1-5 | 0.4 | 20 | 8 | 0 | 0 |
| Preparation Example 2-6 | 2 g of Preparation Example 1-6 | 0.4 | 20 | 8 | 0 | 0 |
| Preparation Example 2-7 | 2 g of Preparation Example 1-3 | 0.4 | 28 | 0 | 0 | 0 |
| Comparative Example 1-1 | — | 0 | 0 | 0 | 0 | 0 |
| Comparative Example 1-2 | 2 g of Preparation Example 1-1 | 0.4 | 0 | 0 | 14 | 14 |
| Comparative Example 1-3 | 2 g of Preparation Example 1-2 | 0.4 | 0 | 0 | 14 | 14 |
| Comparative Example 1-4 | 2 g of Preparation Example 1-3 | 0.4 | 0 | 0 | 14 | 14 |
| Comparative Example 1-5 | 2 g of Preparation Example 1-4 | 0.4 | 0 | 0 | 14 | 14 |
| Comparative Example 1-6 | 2 g of Preparation Example 1-5 | 0.4 | 0 | 0 | 14 | 14 |
| Comparative Example 1-7 | 2 g of Preparation Example 1-6 | 0.4 | 0 | 0 | 14 | 14 |
| Comparative Example 1-8 | 2 g of Preparation Example 1-3 | 0.4 | 0 | 0 | 21 | 7 |
| Comparative Example 1-9 | 2 g of Preparation Example 1-3 | 0.4 | 0 | 0 | 7 | 21 |

Hereinafter, referring to FIGS. 1 to 8, a substrate cleaning method according to exemplary embodiments will be described.

FIG. 1 is a flowchart of a method of cleaning a substrate according to some embodiments. FIGS. 2 to 6 illustrate stages in a method of cleaning a substrate according to FIG. 1. For the convenience of description, the parts overlapping with those described above for the substrate cleaning composition may be briefly described or omitted.

Figure 2:
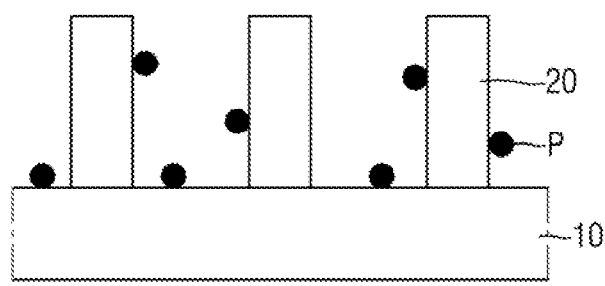
FIGS. 2 to 6 are stages in a method of cleaning a substrate according to FIG. 1.

Referring to FIGS. 1 and 2, a substrate 10 may be provided (S10).

The substrate 10 may be a semiconductor substrate. In an implementation, the substrate 10 may be bulk silicon or silicon-on-insulator (SOI). The substrate 10 may be a silicon substrate, or include a different material, e.g., silicon germanium, silicon germanium on insulator (SGOI), indium antimonide, a lead tellurium compound, indium arsenide, indium phosphide, gallium arsenide or gallium antimonide. In an implementation, the substrate 10 may have an epitaxial layer on a base substrate.

There may be particles P on the substrate 10. The particles P may be residues or contaminants remaining on the substrate 10. The particles P may be microparticles with a small diameter.

In an implementation, micropatterns 20 may be formed on the substrate 10. The particles P may be present on the micropatterns 20. In an implementation, the particles P may be residues or contaminants generated from the formation of the micropatterns 20.

In an implementation, the micropatterns 20 may be formed with an inorganic film. In an implementation, the micropatterns 20 may include a conductive material such as a metal, a metal nitride or a metal silicide nitride film; an insulating material such as silicon oxide, silicon nitride or silicon oxynitride; or a semiconductor material such as polysilicon.

The micropatterns 20 may be spaced a predetermined distance (line width) apart on the substrate 10. In an implementation, the line width of the micropatterns 20 may be approximately 50 nm or less. In an implementation, the micropatterns 20 may have a high aspect ratio. In an implementation, the aspect ratio of the micropatterns 20 may be approximately 10 or more.

Figure 3:
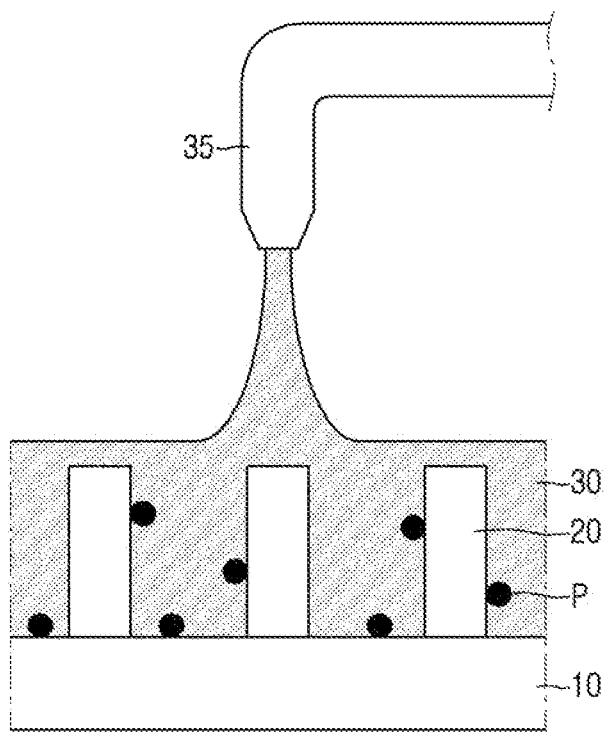

Referring to FIGS. 1 and 3, a substrate cleaning composition 30 may be provided on the substrate 10 (S20).

The substrate cleaning composition 30 may be the above-described substrate cleaning composition. In an implementation, the substrate cleaning composition 30 may include the styrene copolymer, the additive, and the alcoholic solvent. In an implementation, the substrate cleaning composition 30 may further include the surfactant.

The substrate cleaning composition 30 may be provided from, e.g., a nozzle 35. In an implementation, the nozzle 35 may apply the substrate cleaning composition 30 on the substrate 10 and the micropatterns 20. In an implementation, the substrate cleaning composition 30 may be applied on the substrate 10 by various methods such as spin coating or roll coating.

The substrate cleaning composition 30 may fill a space between the micropatterns 20. In an implementation, the substrate cleaning composition may include hydrophilic functional groups (e.g., carboxyl groups), and it may interact with the substrate 10 to easily fill the space between the micropatterns 20 without voids.

Figure 4:
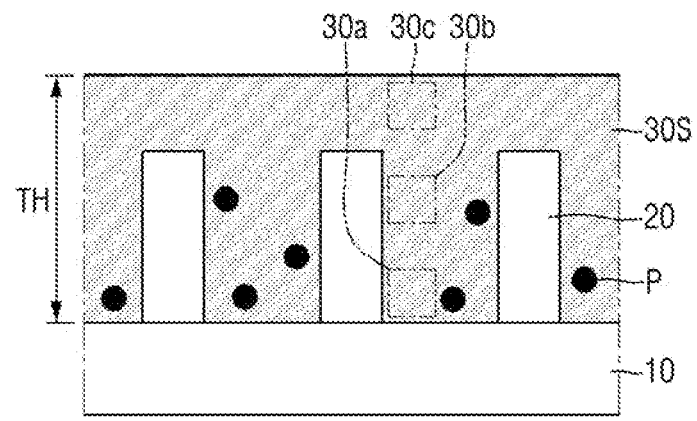

Referring to FIGS. 1 and 4, the substrate cleaning composition 30 may be dried (S30).

As the substrate cleaning composition 30 is dried, a solid coating film 30S may be formed on the substrate 10. In an implementation, as the substrate cleaning composition 30 is dried, a part or all of volatile components (e.g., the alcoholic solvent or the like) in the substrate cleaning composition 30 may be volatilized. Therefore, the substrate cleaning composition 30 may be solidified or cured and shrunk, thereby detaching particles P from the substrate 10 and/or the micropatterns 20. Here, solidification means becoming a solid, and curing means linking molecules (e.g., crosslinking or polymerization).

Drying the substrate cleaning composition 30 may be performed, e.g., at approximately 30 to 200° C. for approximately 5 seconds to 10 minutes. In an implementation, drying the substrate cleaning composition 30 may be performed at approximately 40 to 100° C. for approximately 30 seconds to approximately 5 minutes.

The coating film 30S may include a lower part 30a, a middle part 30b, and an upper part 30c, which are sequentially on the substrate 10. In an implementation, the content of the additive in the lower part 30a of the coating film 30S and the content of the additive in the upper part 30c of the coating film 30S may each be higher than the content of the additive in the middle part 30b of the coating film 30S.

In an implementation, the thickness (TH) of the coating film 30S may be approximately 90 to 5,000 nm. Here, the thickness (TH) of the coating film 30S means an average thickness of the coating film 30S. When the thickness (TH) of the coating film 30S is approximately 90 to 5,000 nm, a rinsing solution to be described below (40 in FIG. 5) may easily penetrate into the coating film 30S. This will be described in further detail with reference to FIGS. 11 and 12. In an implementation, the thickness (TH) of the coating film 30S may be approximately 200 to 2,000 nm. In an implementation, the thickness (TH) of the coating film 30S may be approximately 300 to 1,000 nm.

Figure 5:
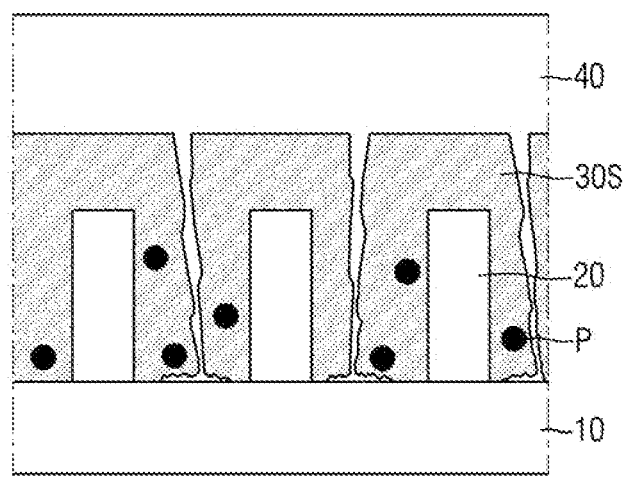

Referring to FIGS. 1 and 5, the substrate 10 is rinsed (S40).

In an implementation, a rinsing solution 40 may be provided on the coating film 30S. The rinsing solution 40 may penetrate into the coating film 30S. As a result, the particles P, along with the coating film 30S, may be removed from the substrate 10 and micropatterns 20. The substrate cleaning composition may include a hydrophilic functional group (e.g., a carboxyl group), and it may interact with the rinsing solution 40, thereby allowing the rinsing solution 40 to easily penetrate into the coating film 30S.

In an implementation, the rinsing solution 40 may include, e.g., water, an alcoholic solvent, an alkaline aqueous solution, or a combination thereof. In an implementation, the rinsing solution 40 may include deionized water.

In an implementation, the alcoholic solvent may be, e.g., a thinner, isopropyl alcohol (IPA), 4-methyl-2-pentanol (MIBC), toluene, an ester acetate solvent, an alcohol solvent, or a glycol (e.g., propylene glycol monomethyl ether) solvent.

The alkaline aqueous solution may be an alkaline developing solution, e.g., ammonia, tetramethylammonium hydroxide (TMAH), or choline.

Rinsing the substrate 10 may also include sequentially providing different rinsing solutions 40 onto the coating film 30S. In an implementation, rinsing the substrate 10 may include, first, providing deionized water on the coating film 30S, and then providing an alkaline developing solution.

In an implementation, as described in the description of FIG. 4, the content of the additive in the lower part 30a of the coating film 30S and the upper part 30c of the coating film 30S may be larger than that of the additive in the middle part 30b of the coating film 30S. In this case, the rinsing solution 40 may be introduced into the upper part 30c of the coating film 30S with a high content of the additive. In addition, the rinsing solution 40 may easily spread into the lower part 30a of the coating film 30S with a high content of the additive. Therefore, the rinsing solution 40 may easily remove the coating film 30S and the particles P from the substrate 10 and the micropatterns 20.

In an implementation, drying the substrate cleaning composition 30 (S30) may be omitted. In an implementation, after the substrate cleaning composition 30 is provided on the substrate 10 (S20), the substrate 10 may be rinsed without heating the substrate cleaning composition 30 (e.g., without a baking process) (S40).

Figure 6:
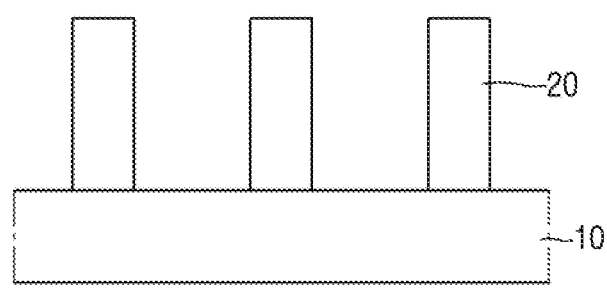

Referring to FIGS. 1 and 6, the substrate 10 may be dried (S50). Therefore, the substrate 10 and the micropatterns 20 (from which particles P have been removed) may be provided.

As described above, particles (P) may be detached by shrinking the substrate cleaning composition through solidification or curing, compared to a physical cleaning method provided by a liquid or gas (e.g., a droplet or bubble), and the particles P may be detached with a relatively low force.

In an implementation, as described above, the substrate cleaning composition may easily fill a space between the micropatterns 20, and the microparticles P may also be easily removed. Therefore, in the substrate cleaning method, damage to micropatterns 20 may be prevented and microparticles may be easily removed.

Figure 7:
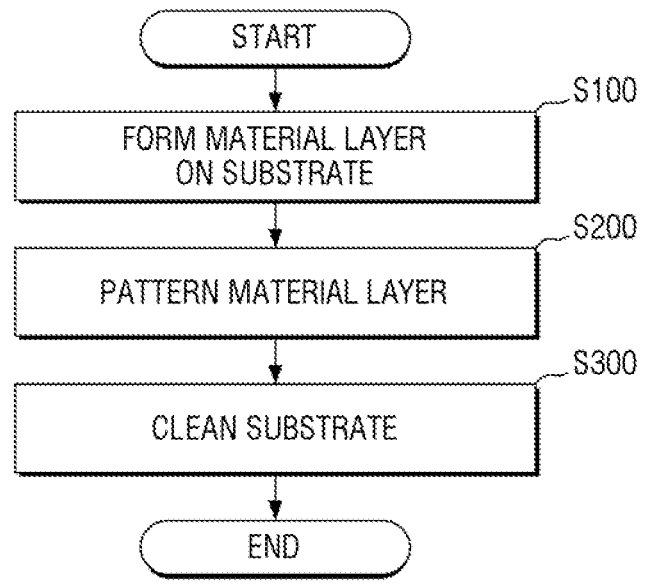
FIG. 7 is a flowchart of a method of fabricating a semiconductor device according to some embodiments.
Figure 8:
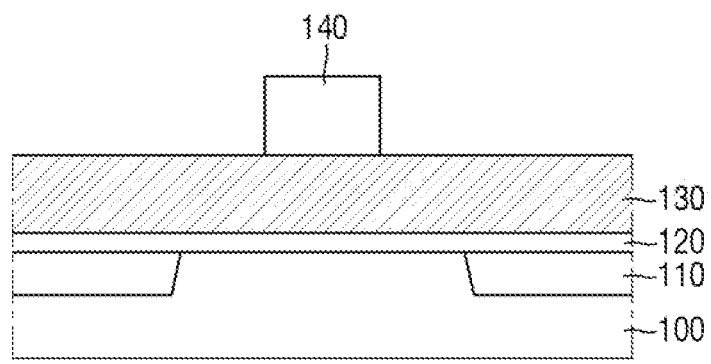
FIGS. 8 to 10 are stages in a method of fabricating a semiconductor device according to FIG. 7.
Figure 9:
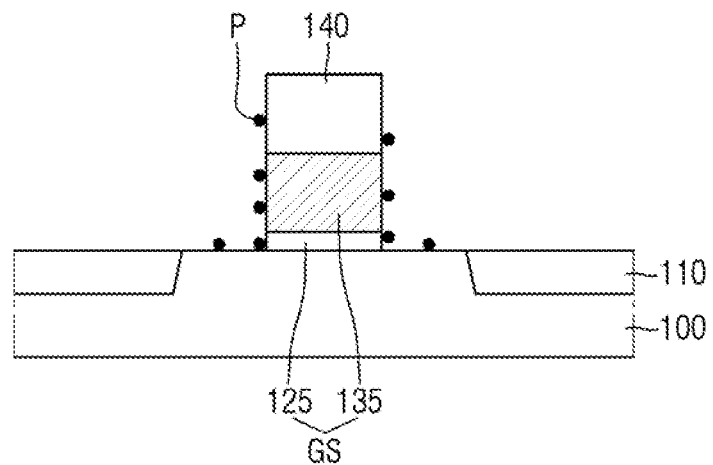
Figure 10:
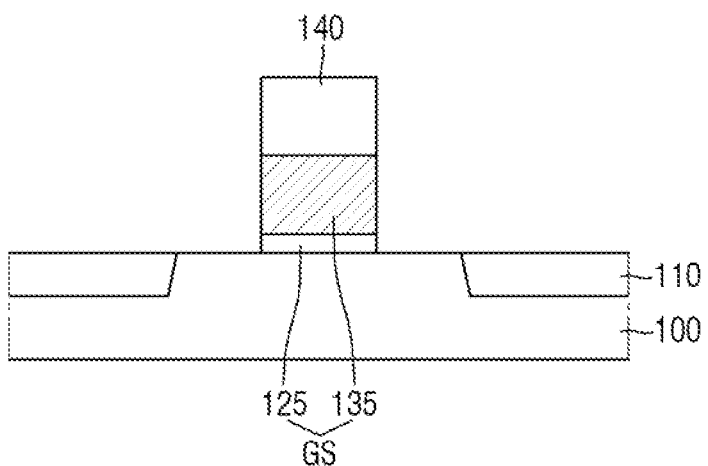

FIG. 7 is a flowchart of a method of fabricating a semiconductor device according to some embodiments. FIGS. 8 to 10 are stages in a method of fabricating a semiconductor device according to FIG. 7. For the convenience of description, parts overlapping those described above for the substrate cleaning composition with reference to FIGS. 1 to 5 may be briefly described or omitted.

Referring to FIGS. 7 and 8, material films 120 and 130 may be formed on a semiconductor substrate 100.

The semiconductor substrate 100 may be bulk silicon or silicon-on-insulator (SOI). The semiconductor substrate 100 may be a silicon substrate, or include a different material, e.g., silicon germanium, silicon germanium on insulator (SGOI), indium antimonide, a lead tellurium compound, indium arsenide, indium phosphide, gallium arsenide, or gallium antimonide. In an implementation, the semiconductor substrate 100 may have an epitaxial layer on a base substrate.

In an implementation, an element isolation film 110 may be formed in the semiconductor substrate 100. The element isolation film 110 may define an active region in the semiconductor substrate 100. In an implementation, the element isolation film 110 may be an oxide film formed by, e.g., a Shallow Trench Isolation (STI) process or a LOCal Oxidation of Silicon (LOCOS) process.

In an implementation, the material films 120 and 130 may include a first material film 120 and a second material film 130, which are sequentially stacked on the semiconductor substrate 100.

The first material film 120 may include, e.g., silicon oxide, silicon oxynitride, silicon nitride, or a high-k dielectric material having a higher dielectric constant than silicon oxide. In an implementation, the high-k dielectric material may include, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

In an implementation, the second material film 130 may include, e.g., poly-silicon (poly-Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), tungsten (W), or a combination thereof.

Referring to FIGS. 7 and 9, the material films 120 and 130 may be patterned.

In an implementation, a mask pattern 140 may be formed on the material films 120 and 130. Subsequently, an etching process using the mask pattern 140 as an etch mask may be performed. In an implementation, a material pattern (GS) may be formed on the semiconductor substrate 100. After the material pattern GS is formed, the mask pattern 140 may be removed.

In an implementation, the material pattern GS may include a gate dielectric film 125 and a gate electrode 135. Accordingly, a gate structure may be implemented on the semiconductor substrate 100.

As the material films 120 and 130 are patterned, particles P may be formed on the semiconductor substrate 100 or the material pattern GS. The particles P may be residues or contaminants generated from the material films 120 and 130.

Referring to FIGS. 7 and 10, the semiconductor substrate 100 may be cleaned.

Cleaning the semiconductor substrate 100 may include the substrate cleaning method described above using FIGS. 1 to 6. In an implementation, the substrate cleaning composition may be provided on the semiconductor substrate 100 (S20), the substrate cleaning composition may be dried (S30), the semiconductor substrate 100 may be rinsed (S40), and the semiconductor substrate 100 may be dried (S50). Accordingly, the semiconductor substrate 100 and the material pattern GS from which particles P are removed may be provided. In an implementation, the method of fabricating a semiconductor method may help prevent damage to micropatterns 20 and microparticles may be easily removed.

Hereinafter, with reference to FIGS. 11 and 12, the following Experimental Examples and Comparative Examples, the effect of a substrate cleaning composition according to some embodiments will be described in further detail.

In order to evaluate substrate cleaning compositions according to Preparation Examples 2-1 to 2-7 and Comparative Examples 1-1 to 1-9, coating properties, gap-filling ability, particle clearance and coating film removability were evaluated and shown in Table 3 below.

Coating Properties Evaluation

The coating properties of substrate cleaning compositions according to Preparation Examples 2-1 to 2-7 and Comparative Examples 1-1 to 1-9 for the bare wafer were evaluated using ACT-8. The thickness of the coating film was measured using the SFX-200 thickness measuring device, and the thickness Max-Min value was recorded. If the Max-Min difference was 100 Å or less, it was marked as good, if the Max-Min difference was 100 Å to less than 500 Å, it was marked as normal, and if the Max-Min difference was 500 Å or more, it was marked as bad.

Gap-Filling Ability Evaluation

By spin-coating substrate cleaning compositions according to Preparation Examples 2-1 to 2-7 and Comparative Examples 1-1 to 1-9 on a silicon wafer having a 20 nm L/S pattern formed thereon, coating films having thicknesses of 300 nm were formed. Then, the wafer on which the coating film was formed was cut, and the degree of gap-filling was measured using FE-SEM (S-4800/Hitachi).

Particle Clearance Evaluation

Silica particles of 20 nm to 200 nm were applied on a silicon wafer using a spin-coating, and then substrate cleaning compositions according to Preparation Examples 2-1 to 2-7 and Comparative Examples 1-1 to 1-9 were spin-coated to form coating films. Deionized water was supplied on the coating films for 120 seconds, and then a developer was supplied for 120 seconds to remove the coating films. By measuring the number of silica particles present on the silicon wafer using a Dark Field inspection device, the particle clearance with respect to the initial number of silica particles was calculated.

Coating Film Removability Evaluation

Coating films were formed by spin-coating substrate cleaning compositions according to Preparation Examples 2-1 to 2-7 and Comparative Examples 1-1 to 1-9 on a silicon wafer, and OP-2600/KLA-Tencor was used to measure the thicknesses of the coating films. And then, the coating film removability was measured by supplying a developer or deionized water on the coating films for 120 seconds, respectively, and measuring the thicknesses of the coating films again.

TABLE 3

| | Coating Properties | Gap-Filling | Particle Clearance (%) | Coating Film Removability | |
|---|---|---|---|---|---|
| | | | | Developer | DI water |
| Preparation Example 2-1 | good | O | 91 | O | O |
| Preparation Example 2-2 | good | O | 86 | O | O |
| Preparation Example 2-3 | good | O | 94 | O | O |
| Preparation Example 2-4 | good | O | 94 | O | O |
| Preparation Example 2-5 | good | O | 92 | O | O |
| Preparation Example 2-6 | good | O | 89 | O | O |
| Preparation Example 2-7 | good | O | 51 | O | O |
| Comparative Example 1-1 | — | — | 9 | — | — |
| Comparative Example 1-2 | bad | — | 0 | O | X |
| Comparative Example 1-3 | bad | — | 0 | O | X |
| Comparative Example 1-4 | normal | — | 0 | O | X |
| Comparative Example 1-5 | good | — | 0 | O | X |
| Comparative Example 1-6 | bad | — | 0 | O | X |
| Comparative Example 1-7 | good | — | 0 | O | X |
| Comparative Example 1-8 | good | — | 0 | O | X |
| Comparative Example 1-9 | bad | — | 0 | O | X |

Referring to Table 3, substrate cleaning compositions according to Preparation Examples 2-1 to 2-7 exhibit excellent coating properties and excellent gap-filling ability on the wafer, and exhibit excellent removability with respect to developer and/or deionized water. In particular, compared with Comparative Example 1-1 in which the substrate cleaning composition is not used, it can be confirmed that substrate cleaning compositions according to Preparation Examples 2-1 to 2-7 exhibit very excellent particle removal ability. In addition, compared with Comparative Examples 1-2 to 1-9 in which the alcoholic solvent is not used as the organic solvent, the substrate cleaning compositions according to Preparation Examples 2-1 to 2-7 exhibit very good coating properties and particle removal ability, and exhibit very good removability not only for the developer but also for deionized water.

Figure 11:
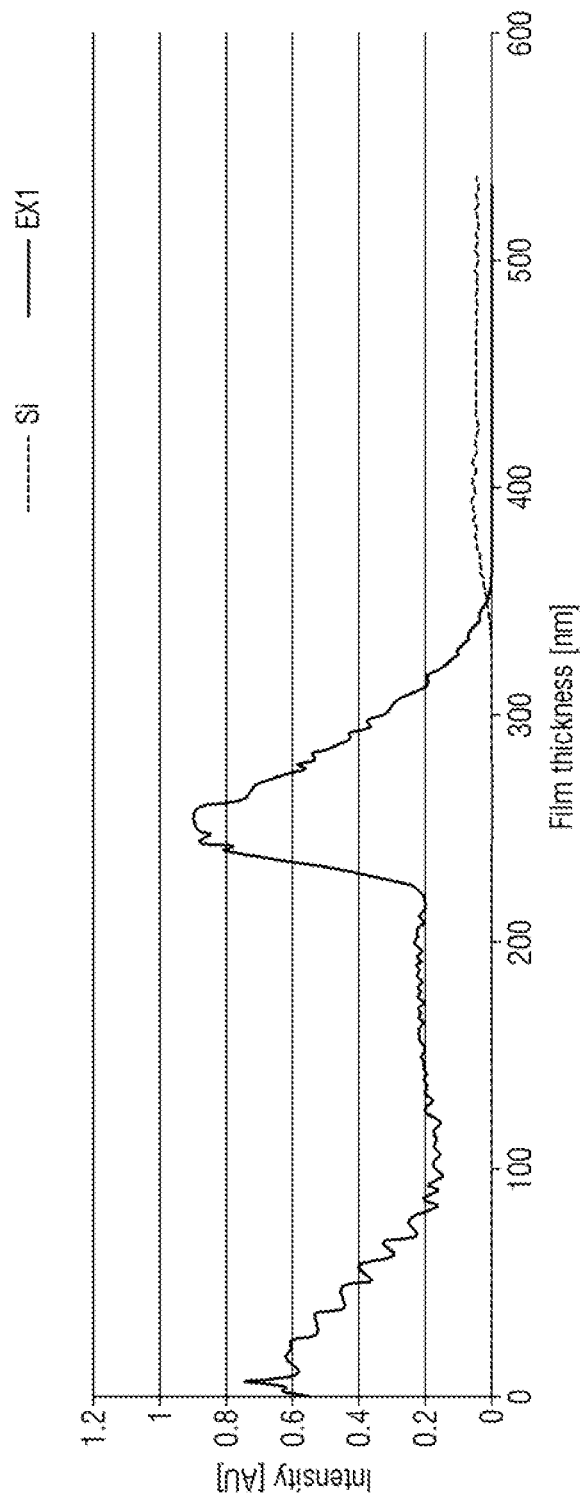
FIGS. 11 and 12 are graphs of properties of a substrate cleaning composition in a substrate cleaning method according to some embodiments.
Figure 12:
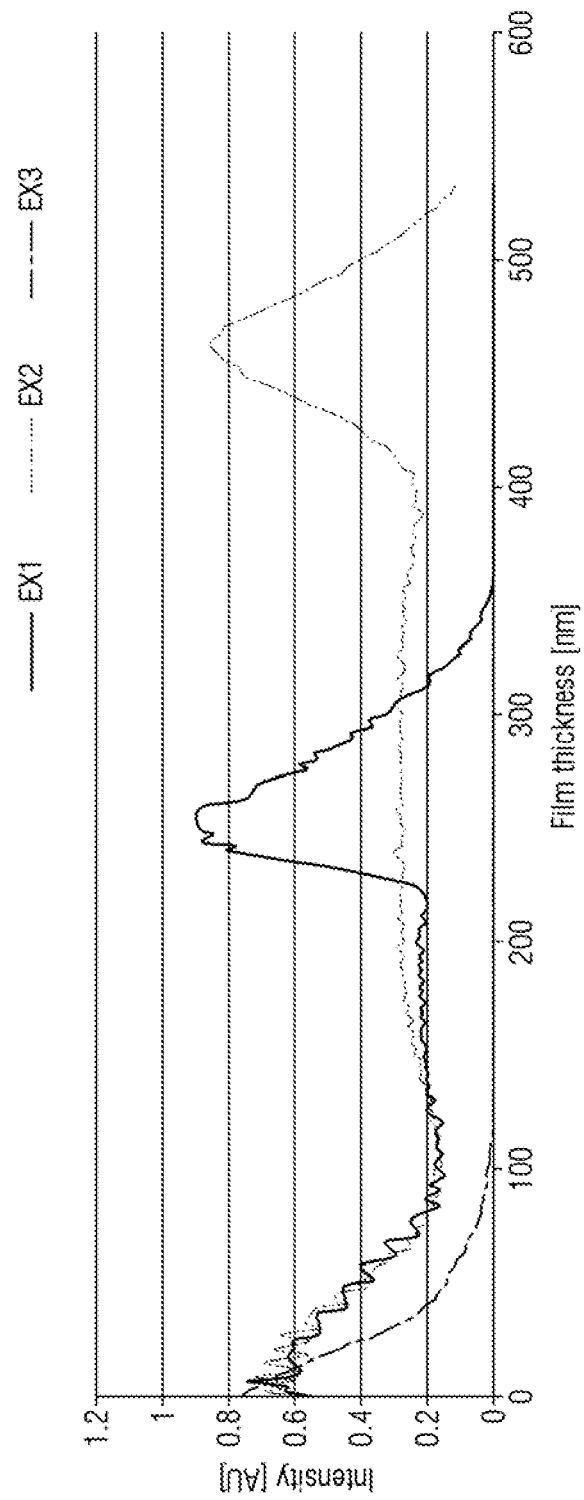

FIGS. 11 and 12 are graphs of properties of a substrate cleaning composition in a substrate cleaning method according to some Examples and Comparative Examples. For the convenience of description, parts overlapping those described above for the substrate cleaning composition using FIGS. 1 to 10 will be briefly described or omitted.

Experimental Example 1

A coating film (e.g., 30S of FIG. 4) with an average thickness of 350 nm was formed by applying the substrate cleaning composition prepared according to Preparation Example 2-3 described above on a silicon substrate (e.g., 10 of FIG. 2) at ambient temperature (25° C.).

Experimental Example 2

A coating film was formed in a similar method to Experimental Example 1, except that a 540-nm thick coating film was formed on a silicon substrate (wafer).

Experimental Example 3

A coating film was formed in a similar method to Experimental Example 1, except that a 90-nm thick coating film was formed on a silicon substrate (wafer).

FIG. 11

In the resulting product formed according to Experimental Example 1, the content ratio of silicon (Si) according to a thickness and the content ratio of the additive according to a thickness are shown in FIG. 11. For reference, the horizontal axis in FIG. 11 is the thickness measured from the upper surface of the coating film (e.g., a thickness of 0 nm is at the upper surface of the coating film).

Referring to FIG. 11, it may be seen that the content of the additive in the upper part of the coating film (e.g., 0 to approximately 100 nm) and the lower part of the coating film (e.g., approximately 220 to 350 nm) was higher than the content of the additive in the middle part of the coating film (e.g., approximately 100 to 220 nm). Accordingly, a rinsing solution (e.g., 40 of FIG. 5) may be easily introduced into the upper part of the coating film (e.g., 30c of FIG. 4), and easily spread into the lower part of the coating film (e.g., 30a of FIG. 4).

Without being bound by theory, the content of the additive in the upper part of the coating film may be larger than that of the additive in the middle part of the coating film because the additive, which is relatively light due to volatilization of a volatile component (the alcoholic solvent or the like) in the substrate cleaning composition, may be pushed up to the upper part of the coating film. The content of the additive in the lower part of the coating film may be larger than that of the additive in the middle part due to the interaction between the additive having a hydrophilic functional group (e.g., a carboxyl group) and a substrate.

FIG. 12

In the resulting products formed according to Experimental Examples 1 to 3, respectively, the content ratio of the additive according to a thickness is shown in FIG. 12. For reference, the horizontal axis in FIG. 12 represents a thickness measured from the top surface of the coating film.

Referring to FIG. 12, as in Experimental Example 1, in Experimental Example 2, it may be seen that the content of the additive in the upper part of the coating film (e.g., 0 to approximately 100 nm) and the lower part of the coating film (e.g., approximately 400 to 540 nm) were larger than the content of the additive of the middle part of the coating film (e.g. approximately 100 to 400 nm).

Unlike this, in Experimental Example 3, it may be seen that the content of the additive was gradually reduced toward the lower part of the coating film from the upper part of the coating film. Therefore, when the thickness of the coating film 30S is approximately 100 nm or more, it may be seen that the rinsing solution (e.g., 40 of FIG. 5) can more easily spread into the lower part of the coating film (e.g., 30a of FIG. 4).

Experimental Example 4

Particles were formed by forcibly contaminating a silicon substrate with silica ($SiO_2$) particles having a diameter of 19 nm or more formed on a silicon substrate (wafer).

Subsequently, a coating film with an average thickness of 350 nm was formed by applying the substrate cleaning composition prepared according to Preparation Example 2-3 on the silicon substrate by a spin coating method at ambient temperature (25° C.). Subsequently, as a rinsing solution, deionized water was used to remove the coating film, and the silicon substrate from which the coating film was removed was dried by a spin drying method.

Subsequently, the entire surface of the substrate was analyzed using a particle inspection device a Dark Field inspection device, thereby evaluating the particle removal ability of the substrate cleaning composition.

Experimental Example 5

Particle removal ability was evaluated in a similar manner to Experimental Example 4, except that the substrate cleaning composition prepared according to Preparation Example 2-3 was applied on a silicon substrate including a predetermined pattern (hereinafter, pattern A substrate).

Experimental Example 6

Particle removal ability was evaluated in a similar manner to Experimental Example 4, except that the substrate cleaning composition prepared according to Preparation Example 2-3 was applied on a silicon substrate including another predetermined pattern (hereinafter, pattern B substrate).

Experimental Example 7

Particle removal ability was evaluated in a similar manner to Experimental Example 4, except that the substrate cleaning composition prepared according to Preparation Example 2-3 was applied on a silicon substrate including still another predetermined pattern (hereinafter, pattern C substrate).

Comparative Example 2-1

The particle removal ability for the pattern B substrate was evaluated using a spray method without using a substrate cleaning composition.

Comparative Example 2-2

The particle removal ability for the pattern C substrate was evaluated using a spray method without using a substrate cleaning composition.

The particle removal ability of the substrate cleaning compositions according to Experimental Examples 4 to 7 and Comparative Examples 2-1 and 2-2 is shown in Table 4 below.

TABLE 4

|  | Substrate | Number of particles after forced contamination [EA] | Number of particles after cleaning [EA] | Particle Clearance (%) |
|---|---|---|---|---|
| Experimental Example 4 | Silicon substrate | 19714 | 867 | 95.6 |
|  |  | 21793 | 991 | 95.5 |
|  |  | 18754 | 901 | 95.2 |
| Experimental Example 5 | pattern A substrate | 23504 | 23 | 99.9 |
|  |  | 232930 | 207 | 99.9 |
| Experimental Example 6 | pattern B substrate | 42080 | 1042 | 97.5 |
| Comparative Example 2-1 |  | 2961 | 2738 | 7.5 |
| Experimental Example 7 | pattern C substrate | 38337 | 2722 | 92.9 |
| Comparative Example 2-2 |  | 2330 | 2132 | 8.5 |

Referring to Table 4, compared with the substrate cleaning compositions according to Comparative Examples 2-1 and 2-2, it may be seen that the substrate cleaning compositions according to Experimental Examples 4 to 7 showed very excellent particle removal ability.

Accordingly, a substrate cleaning composition capable of preventing damage to micropatterns and easily removing microparticles may be provided.

By way of summation and review, to remove particles, a physical cleaning method provided by a liquid or gas (e.g., a droplet or bubble) may be performed. Such a physical cleaning method may use a high pressure to remove microparticles, and damage, e.g., the collapse or leaning of micropatterns formed on a substrate, could occur.

One or more embodiments may provide a substrate cleaning composition including a polymer.

One or more embodiments may provide a substrate cleaning composition which can help prevent damage to micropatterns and easily remove the microparticles.

One or more embodiments may provide a method of cleaning a substrate using a substrate cleaning composition which can help prevent damage to micropatterns and easily remove microparticles.

One or more embodiments may provide a method of fabricating a semiconductor device using a substrate cleaning composition which can help prevent damage to micropatterns and easily remove the microparticles.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A substrate cleaning composition, comprising:
   a styrene copolymer including a first repeating unit represented by Formula 1-1a and a second repeating unit represented by Formula 1-1b;
   an additive represented by Formula 2-1; and
   an alcoholic solvent having a solubility of 500 g/L or less in deionized water,

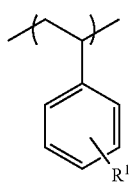

[Formula 1-1a]

wherein, in Formula 1-1a, $R^1$ is a hydrogen atom, or a substituted or unsubstituted C1 to C20 hydrocarbon group,

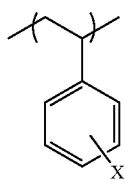

[Formula 1-1b]

wherein, in Formula 1-1b, X is a hydrophilic functional group, $$R^2 Y_p \quad \text{[Formula 2-1]}$$

wherein, in Formula 2-1, $R^2$ is a substituted or unsubstituted C3 to C25 hydrocarbon group, Y is a hydrophilic functional group, and p is a natural number.

2. The composition as claimed in claim 1, wherein, in Formula 1-1b, X is a carboxyl group.

3. The composition as claimed in claim 1, wherein, in Formula 2-1, Y is a carboxyl group.

4. The composition as claimed in claim 1, wherein the solubility of the alcoholic solvent in deionized water is 250 g/L or less.

5. The composition as claimed in claim 1, wherein the alcoholic solvent includes n-butanol or 4-methyl-2-pentanol.

6. The composition as claimed in claim 1, wherein the composition includes 5 to 20 wt % of the styrene copolymer, based on a total weight of the composition.

7. The composition as claimed in claim 1, wherein the composition includes 0.001 to 20 wt % of the additive, based on a total weight of the composition.

8. The composition as claimed in claim 1, wherein the styrene copolymer has a weight-average molecular weight of 500 to 100,000.

9. The composition as claimed in claim 1, further comprising a surfactant.

10. The composition as claimed in claim 9, wherein a concentration of the surfactant is 10 to 50,000 ppm.

11. A substrate cleaning composition, comprising:

a styrene copolymer including a first repeating unit represented by Formula 1-2a and a second repeating unit represented by Formula 1-2b;

an additive represented by Formula 2-2; and an alcoholic solvent having a solubility of 500 g/L or less in deionized water,

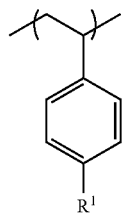

[Formula 1-2a]

wherein, in Formula 1-2a, $R^1$ is a hydrogen atom, or substituted or unsubstituted C1 to C20 hydrocarbon group,

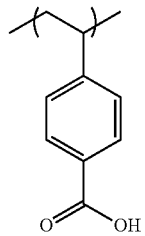

[Formula 1-2b]

$$R^2(COOH)_q \quad \text{[Formula 2-2]}$$

wherein, in Formula 2-2, $R^2$ is a substituted or unsubstituted C3 to C25 hydrocarbon group, q is a natural number of 2 or more.

12. The composition as claimed in claim 11, wherein the solubility of the alcoholic solvent in deionized water is 250 g/L or less.

13. The composition as claimed in claim 11, wherein the alcoholic solvent includes n-butanol or 4-methyl-2-pentanol.

14. The composition as claimed in claim 11, wherein the styrene copolymer has a weight-average molecular weight of 500 to 100,000.

15. The composition as claimed in claim 11, wherein the composition includes:

1 to 50 wt % of the styrene copolymer, and 0.001 to 20 wt % of the additive, all wt % being based on a total weight of the composition.

16. A method of cleaning a substrate, the method comprising:

providing a substrate, providing a substrate cleaning composition on the substrate to form a coating film, and rinsing the substrate to remove the coating film, wherein:

the substrate cleaning composition includes a styrene copolymer including a first repeating unit represented by Formula 1-1a and a second repeating unit represented by Formula 1-1b, an additive represented by Formula 2-1, and an alcoholic solvent having a solubility of 500 g/L or less in deionized water,

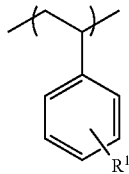
[Formula 1-1a]

in Formula 1-1a, $R^1$ is a hydrogen atom, or a substituted or unsubstituted C1 to C20 hydrocarbon group,

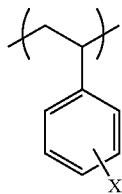
[Formula 1-1b]

wherein, in Formula 1-1b, X is a hydrophilic functional group, $$R^2Y_p \qquad \text{[Formula 2-1]}$$

wherein, in Formula 2-1,
$R^2$ is a substituted or unsubstituted C3 to C25 hydrocarbon group,
Y is a hydrophilic functional group, and
p is a natural number.

17. The method as claimed in claim 16, further comprising drying the substrate, after rinsing the substrate.

18. The method as claimed in claim 16, further comprising drying the substrate cleaning composition on the substrate, after providing the substrate cleaning composition, to form a solid coating film.

19. The method as claimed in claim 16, wherein a thickness of the coating film is 90 nm to 5,000 nm.

20. The method as claimed in claim 16, wherein:
the coating film includes a lower part, a middle part, and an upper part, which are sequentially on the substrate, and
a content of the additive in the lower part of the coating film is larger than a content of the additive in the middle part of the coating film and a content of the additive in the upper part of the coating film is larger than the content of the additive in the middle part of the coating film.

* * * * *